United States Patent [19]

Hempell

[11] 4,078,236

[45] Mar. 7, 1978

[54] REMOTE SWITCHING APPARATUS

[75] Inventor: Leo Bruce Hempell, Almonte, Canada

[73] Assignee: Quality Technology Ltd., Ottawa, Canada

[21] Appl. No.: 565,387

[22] Filed: Apr. 7, 1975

[30] Foreign Application Priority Data

Oct. 2, 1974 Canada .................................. 210606

[51] Int. Cl.² ............................................. H04B 7/00
[52] U.S. Cl. ................................ 343/228; 340/168 B; 343/225
[58] Field of Search ........... 340/164 R, 167 A, 167 R, 340/171 R, 168 R; 343/228, 225; 178/DIG. 15

[56] References Cited

U.S. PATENT DOCUMENTS

| 2,421,022 | 5/1947 | Francis | 340/345 |
| 3,004,241 | 10/1961 | Konig | 340/167 R |
| 3,046,526 | 7/1962 | Scantlin | 340/164 R |
| 3,080,547 | 3/1963 | Cooper | 340/164 R |
| 3,758,864 | 9/1973 | Kanamaru | 340/171 PF |
| 3,900,880 | 8/1975 | Fleischer | 343/228 |

*Primary Examiner*—Harold I. Pitts

[57] ABSTRACT

A remote switching apparatus, in which a transmitter is adapted to transmit a predetermined number of bursts of single frequency signal, to designate a particular digit. Preferably the group of bursts is preceded by a prepulse of particular character which effectively enables the receiver, preparing it to count the bursts which follow and thus to operate a switch corresponding to the digit. The receiver is thus immune to ambient noises except during the short time interval during which it is enabled.

19 Claims, 9 Drawing Figures

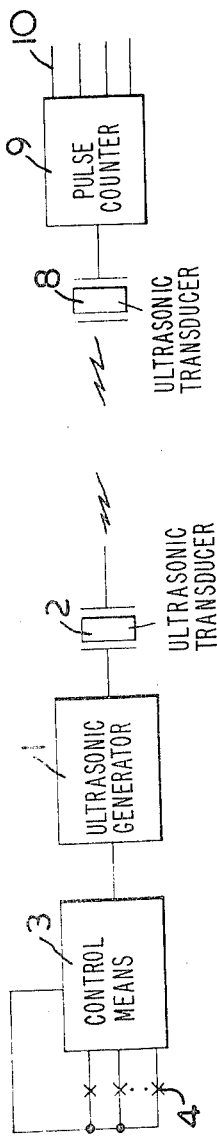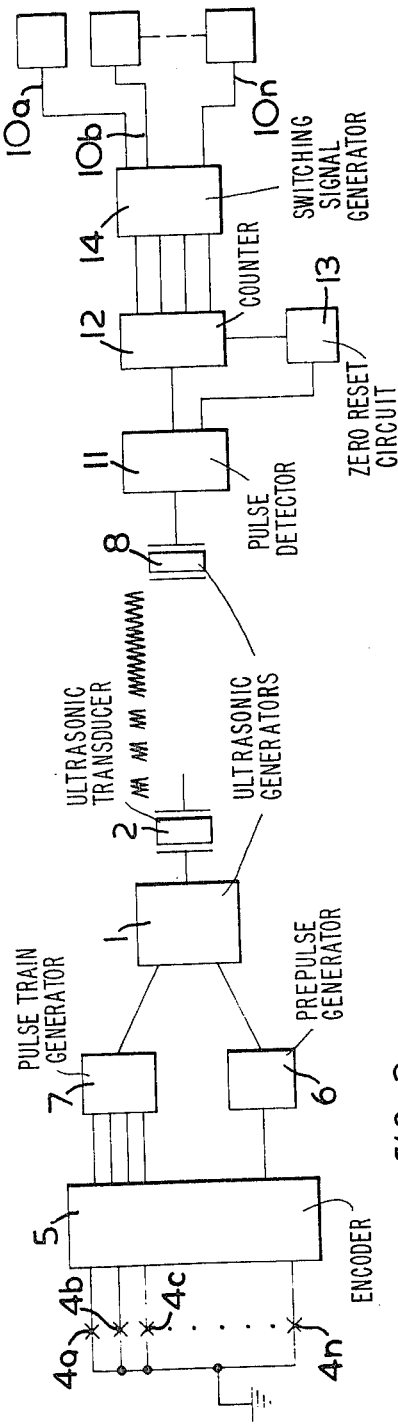

REMOTE SWITCHING APPARATUS

This invention relates to apparatus which can be used to remotely switch apparatus, such as tune a television receiver, by means of a single frequency signal.

A device for tuning a television receiver from a remote location is a useful adjunct thereto; it can allow changing of the controls and the channels without the viewer disturbing his viewing location. In addition, its analog controls can be changed from a position correctly reflecting the viewer environment, rather than very close to the television screen, which can often cause misadjustment. Many sets are therefore sold with a remote control, particularly for changing channels.

Remote controls of this sort have generally taken three forms. The first involves a switch box directly connected to the television set by a cable. This has the undesirable structure of a cable of many wires which must be hidden by the resident of the home (often a difficult matter), which can be unsightly, and on which someone can trip as the unwary cross the room. Also, the wires sometimes break, requiring an expensive service call.

A common wireless system utilizes a remote device which generates a pair of tones, each tone being actuated by push button. One tone is used for increasing the channel number, and the second is used for decreasing the channel number. By pushing the proper button, the channels are caused to step sequentially up or down to the desired channel. Once the correct channel has been selected, the push button is released by the operator, and no further stepping occurs. Since the stepping rate is typically one-half to one second per step, the selection sequence is slow and often annoying when a large number of channels must be traversed. Clearly, this remote control structure is not practical where a large number of channels are to be stepped, i.e., through the entire VHF and UHF television spectrum from channel 2 through 83. In addition, the operator must have knowledge of what channel is actually on the screen to reliably choose another selected channel. This often requires walking to the television receiver, a negation of the remote control advantages.

A third structure for remotely selecting channels overcomes many of the user problems associated with the last-described system, in that a stepping system is not used. In this system, the operator enters the channel number desired, whereupon a multi-tone signal of predetermined frequencies corresponding to the selected channel is generated, which frequencies are detected, filtered, decoded, and which provide channel selection signals which correspond to the selected channel. The signals may be used to operate switches which apply the proper potential across the television receiver varactor tuning diode.

The multi-tone system, however, is highly complex, in that individual filters must be used in the remote control receiver to distinguish the specific tones generated. In addition, the filters must be fairly selective in order to distinguish the tones from extraneous noise. Since the receiver tone transducer must receive a variety of signal frequencies, it must be of broad band nature, and cannot be optimized to its maximum efficiency.

I have invented a remote switching apparatus which is wireless, which provides direct channel selection and therefore does not use the slow stepping procedure described earlier through each of the channels for channel selection. It is highly adaptable for use with all channels, and knowledge of what channel is currently on the screen is not required.

In addition, this invention utilizes only a single frequency for selection of all channels, and therefore the transmitting and receiving transducer, filter, etc. can be optimized to maximum efficiency. The filter in particular can have an extremely high Q and therefore further minimize over the other techniques used the probability of actuation by stray noise. The frequency utilized in the preferred embodiment is above audio frequency, is ultrasonic, and therefore is inaudible to the operator. Nevertheless a specific indicator is provided to the operator to show that transmission of the signal is occurring. The operator need only push buttons corresponding to a channel number or to a predetermined code on his transmitting box (which obviously may be a pocket sized hand-held apparatus) whereupon channel selection or another digitally controlled function may be selectively changed.

Suitably modulated light, radio, or other communications means can be used within the intent of this invention, instead of ultrasonic acoustic signals.

Means are provided to substantially remove the possibility of actuation by normal ambient noise pulses, even in the event that the noise is of the same frequency, and duration as the command signal, except during a very short time frame during actual signal transmission.

While the transmitted signals act to change and select a specific potential applied across a varactor tuning diode which is in the television receiver, it is clear that the present invention may be used for a wide variety of remote control functions. For instance, lights may be selectively turned on, off, or dimmed; appliances, visual displays, etc. may be controlled, and the like. Accordingly, while the present description will be directed toward remotely controlling the tuning apparatus in a television receiver, it is not intended and should not be construed as being limited thereto in any respect. In addition, while for ease of description an ultrasonic signal is described, the description should not be construed as being limited thereto as noted earlier.

The present invention is obtained by providing a means for generating a single frequency signal, and means connected to the generating means for sequentially outpulsing the signal a predetermined number of times in response to the actuation of and corresponding to a selection switch. Preferably, the pulses are automatically preceded by a substantially longer prepulse. Since normally a multiplicity of selection switches will be provided, encoding means connected to the switches provides a numerical output, for instance in binary, upon the actuation of any of the switches. Means responsive to the first actuation of one of the switches for the generation of the prepulse signal, and means responsive to the following actuation of one of the switches translates the binary numerical output resulting from the actuation of both the switches to cause generation and ultrasonic transmission of the prepulse followed by the pulsing signal, which corresponds to the encoding of both closed switches.

Within the receiver, means are provided for receiving the ultrasonic signal, counting the number of pulses within the signal, and for providing a switch-operating signal at a terminal corresponding to the pulse count of the ultrasonic signal. The ultrasonic prepulse is utilized to clear the counting means by resetting it to zero, whereupon counting of the following pulses can accurately occur. Counting will not occur unless the prepulse has preceded the signal pulses. The receiver is therefore locked against actuation by noise until it has received the prepulse.

BRIEF DESCRIPTION OF THE DRAWINGS

A better understanding of this invention will be obtained by reference to the description below, and the following drawings, in which:

FIG. 1 is a block diagram of the transmitter of the present invention in its most general form, FIG. 2 is a more detailed block diagram of the transmitter of the present invention, FIG. 3 is a block diagram of the most generalized form of the receiver of the present invention in its most general form, FIG. 4 is a more detailed block diagram of the receiver of the present invention, FIGS. 5 and 6, taken together, placed with FIG. 5 above

DESCRIPTION OF PREFERRED INVENTION

Figure 5:
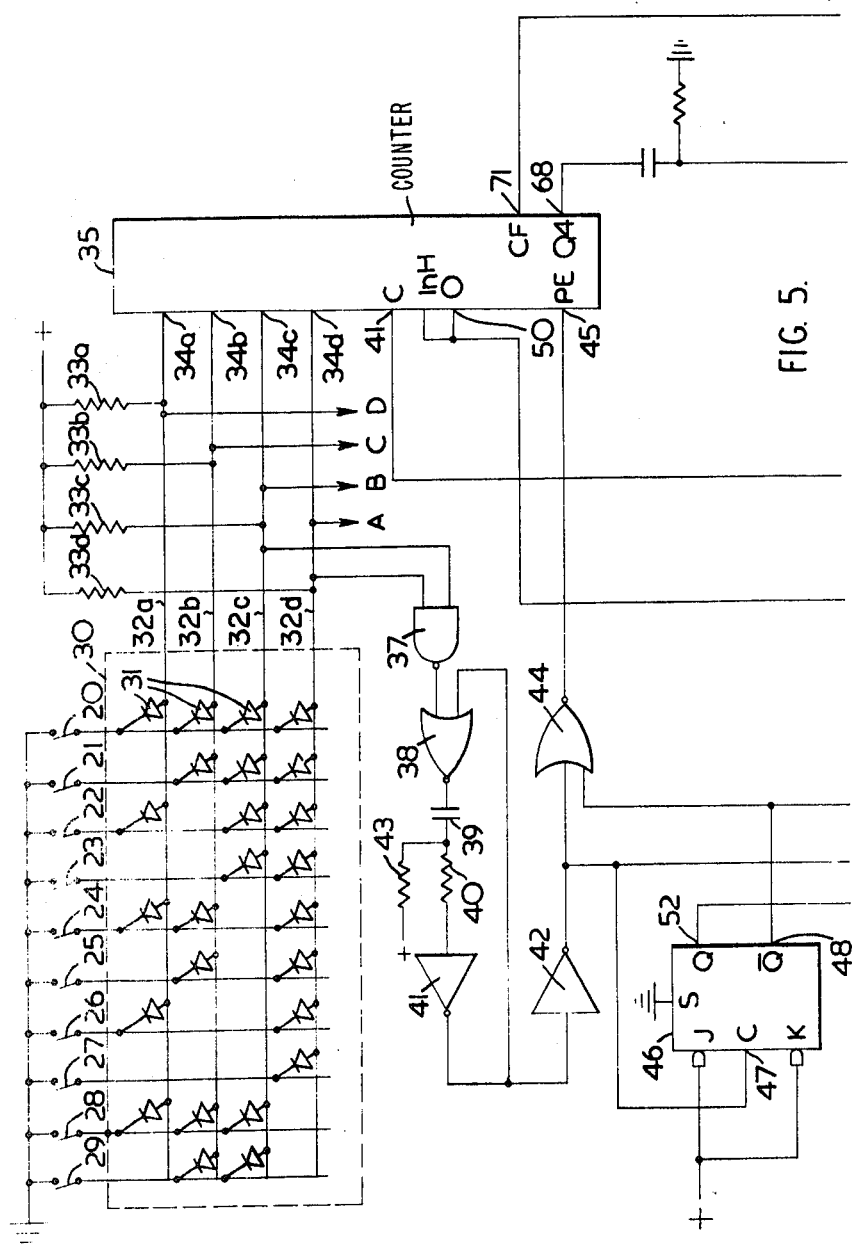

Turning now to FIG. 1, an ultrasonic generator 1 is shown, which has at its output ultrasonic transducer 2. The ultrasonic signal generated thereby is carried through the air to a receiver, which will be described later, and which acts to operate switches in the tuner of a television receiver, or the like. Of course, the signal can also be carried by wire, and the signal could be of electromagnetic nature, such as radio, light, etc.

A control means 3 connected to the ultrasonic generator acts to cause sequential outpulsing of the ultrasonic signal, the number of bursts of signal being selected by a selection switch 4 which is connected to the control means 3.

Accordingly, the closing of selection switch 4 will cause the control means 3 to cause the ultrasonic generator 1 to outpulse a predetermined number of ultrasonic tone bursts via transducer 2. The number of bursts will be counted in the receiver and a switch responsive to the specific count actuated thereby. As the burst presence and duration is what is of importance, the bursts will henceforth be referred to as pulses.

The block schematic shown in FIG. 2 shows a multiplicity of selection switches 4a, 4b, 4c . . . 4n which are connected to encoding means 5. The encoding means provides a numerical output in a form required by a following counter, upon actuation of any of the switches 4a . . . 4n.

Upon closing of a switch, a prepulse generating means 6 causes the ultrasonic generator 1, to which it is connected, to transmit a relatively long pulse, which will precede any further pulse generation. The length of the pulse is longer than any maximum expected ambient noise expected in the environment. The long pulse, which can be counted as one of the pulse train pulses by the receiver if desired, will be here defined by the term "prepulse."

A pulse train generating means 7, responsive to the encoding of the closed switch 4 then causes the ultrasonic generator 1 to transmit a train of pulses which correspond to the coded digit corresponding to the depressed switch.

More preferably, for larger systems such as for tuning a television receiver which will have 12 or a greater number of channels, two switches will be closed sequentially, and will be operated by a push button pad array, whereupon up to 99 functions could be chosen through the use of two sequentially closed switches out of 10, 999 through the use of three, etc. In this preferred form, depression of the first switch will cause generation of the prepulse. After the second switch is closed, the two digit number is decoded and the appropriate number of pulses corresponding to the decoded number is outpulsed to the receiver. Alternatively, the prepulse could be transmitted immediately preceding the train of pulses, following closure of the second switch.

FIG. 3 shows in block diagram the basic elements of the receiver. An ultrasonic transducer 8 feeds the received ultrasonic pulses to circuitry 9 which detects the received pulses, counts them only if a prepulse has preceded them, and provides a switch operating signal corresponding to the pulse count. Preferably, the switch operating signal appears on an output conductor 10 which corresponds to the initially actuated switch in the transmitter.

FIG. 4 is a block diagram of the receiver in more detail. Transducer 8 is shown connected to a detection means 11, which transforms each of the ultrasonic pulses into a pulse envelope signal or the equivalent. The sequential pulses are then fed to a counting means 12 which decodes the pulses, resulting in a digital (say, binary) numerical output signal.

The pulses are preceded by a relatively long prepulse, as described earlier. Prior to the counting, therefore, the prepulse passes through zero reset circuitry 13, causing resetting of the counting means to zero just prior to the initiation of counting of the following pulses.

The counted pulses, preferably (but not necessarily) in binary decoded form is passed to a means 14, which provides a switching signal at one of a number of output conductors 10a, 10b, 10c . . . 10n. The conductor to which the switching signal is applied corresponds to the numerical count of the pulses transmitted. As noted earlier, this may or may not include a count of the prepulse.

Looking briefly at FIGS. 2 and 4 together, in summary, the example will be described by which channel 18 in a tuner of a television receiver is selected.

Initially, a switch of 4a . . . 4n corresponding to the digit 1 will be depressed. As a result, a signal will pass through the encoding means to the prepulse generating means, whereupon a long pulse will cause the ultrasonic generator 1 to generate a continuous ultrasonic tone via the ultrasonic transducer 2.

The continuous tone is picked up by ultrasonic transducer 8 at the receiver, which is located with the television receiver to be tuned. (It can also be located within a frequency converter connected to the television receiver antenna terminals). The continuous tone is detected in the detection means 11, and passed to zero reset circuitry 13, which causes resetting to zero of the counting means 12, which is thereby prepared to receive a series of pulses to be counted.

Following closing of switch 1, the output of which is stored in the encoding means 5, the switch is released and a second switch 4a . . . 4n corresponding to the second digit in the number 18: the 8, is depressed. With the second digit passing into the encoding means 5, a binary representation thereof is passed to the pulse train generating means 7, which causes the ultrasonic generator 1 to terminate the long ultrasonic prepulse still being transmitted, and begin transmitting 18 discrete sequential ultrasonic bursts which corresponds to the number 18 entered via switches 4a . . . 4n.

With the completion of reception of the prepulse, the 18 sequential ultrasonic bursts enter transducer 8 and the envelope thereof is detected by detection means 11. The resulting 18 pulses are then passed to counting means 12, which counts them, and provides a count signal to the switching signal circuitry 14. The switching signal circuitry provides a switching signal on one of conductors 10a . . . 10n, which signal can be used to operate a semi-conductor switch or the like which corresponds to the tuning of channel 18. The preferable but not mandatory method of tuning the channel is to utilize the switch in selection of a voltage which has been established by the use of a resistor network such as a group of potentiometers, which selected voltage is applied to the varactor diode which tunes the television receiver.

In this manner, any of the channels of the television receiver may be selected, VHF, UHF and cable intermediate channels. Some switches or switching designations in conjunction with other circuitry may be directed to other functions, such as turning the television receiver on and off, volume stepping, or varying of other controls. Indeed, since individual switches are remotely controlled by the depression of selected switches on the transmitter, they can be used to tune the varactor diode in an FM radio set, turn on, off, or dim lighting in a home, remotely control electronic combination locks, or control a large variety of useful functions.

Figure 6:
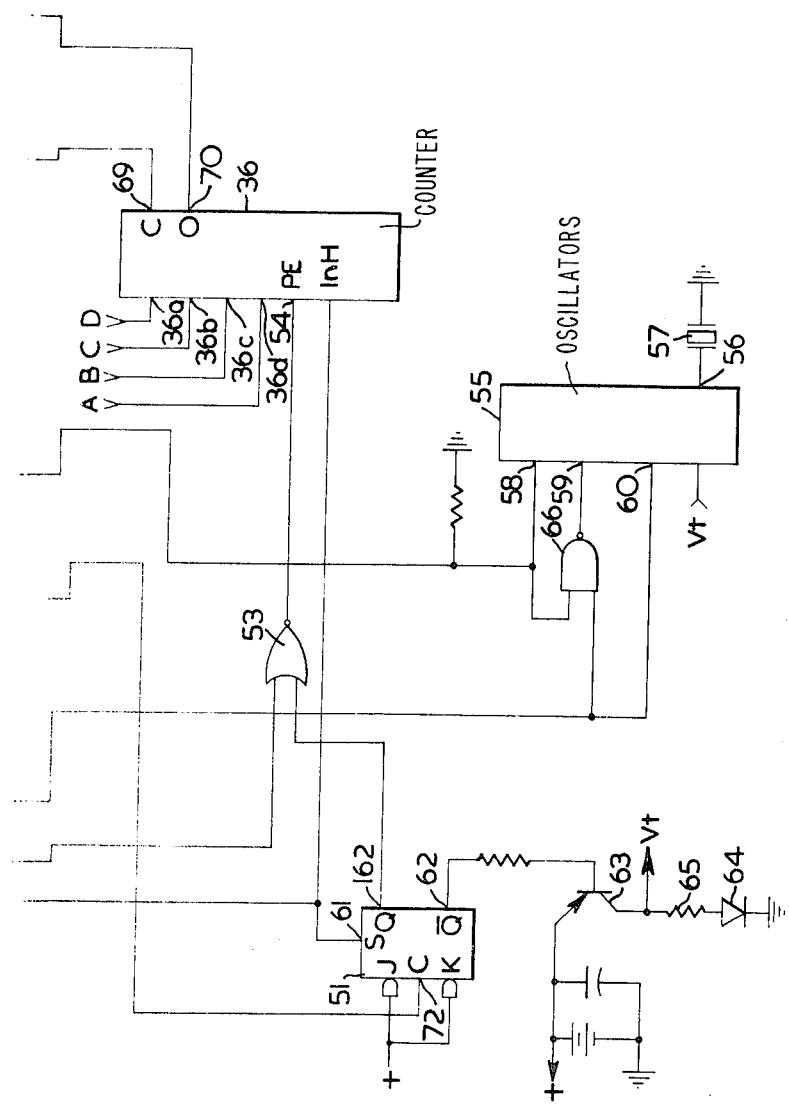
FIG. 6, is a detailed schematic of the transmitter of this invention.

The specific structural details of one form of the transmitter will be described by reference to FIGS. 5 and 6. FIG. 5 is placed adjoining and above FIG. 6.

Temporary make switches 20, 21 . . . 29 respectively are provided for the operator to input the appropriate number, switch 20 corresponding to the input of the zero, switch 21 to the input of a 1, 22 to the input of a 2, 23 to the input of a 3, etc. The switch is usefully arranged as a push button pad in a regular array.

One terminal of each of the switches is connected together and to ground, while each of the other terminals enters an encoding matrix 30, which is designed to change the decimal input into binary. One useful structure for performing this is shown within a dashed line of encoding matrix 30, and is comprised of diodes which interconnect between the ten vertical conductors connected to the individual switches 20 . . . 29, and the four horizontally shown output conductors, in a well known manner via diodes 31.

A binary output will appear at conductors 32a, 32b, 32c, and 32d, each of which is connected through pull-up resistors 33a, 33b, 33c, and 33d to a source of potential +.

Accordingly, in the event that number 18 is to be selected, first the digit 1 will be entered by pushing switch 21. Conducting paths through diodes 31 will therefore exist to binary output conductors 32b, 32c, and 32d. The switch 21 is released, and switch 28 is closed to enter a digit 8. Conducting paths will therefore now exist from ground through switch 8 to binary output conductors 32a, 32b, and 32c. Switch 8 is then released.

In the aforenoted description, the ungrounded conductor of 32a . . . 32d will indicate the specific binary number from zero to nine which is encoded.

Conductors 32a . . . 32d are connected to the binary input terminals 34a, 34b, 34c, and 34d of counter 35, which terminals are connected in parallel with binary input terminals 36a, 36b, 36c, and 36d of a second counter 36 which is similar to counter 35. The first digit is entered in parallel to both counters 35 and 36. When the second digit is entered, counter 36 will be enabled and counter 35 inhibited, causing the second digit to be stored only in counter 36. Counter 35 is thus the tens digit counter, and counter 36 the units counter.

It may be seen that no matter which switch is closed, ground will always be applied to either conductor 32c or 32d (assuming no more than ten switches being present as shown). Either of these lines is therefore used to provide an indication that a digit has been entered. Ground therefore appears at either input of NAND gate 37, which has its two inputs respectively connected to conductors 32c and 32d, when the first switch is closed. The output of NAND gate 37 will therefore go to high potential (or simply "high").

It is well known that mechanical switches very often contain switch bounce, which disturbs the leading and trailing edge of the pulse entered when the switch is closed and then opened. This can give a false pulse count. The following structure and sequence eliminates the effect of the bounce on this circuit.

The output of NAND gate 37 is connected to one of the two inputs of NOR gate 38. The output of NOR gate 38 is connected through capacitor 39 and the series connection of resistor 40 to both of the two inputs of inverter 41 (which can simply be a NAND gate with its two inputs connected together). The output of inverter 41 is connected to the second input of NOR gate 38, as well as to the input of inverter 42. Inverter 42 can be a similar NAND gate as inverter 41.

It should be noted that the logical devices preferred for use in this invention are CMOS integrated circuits which have NOR gates with an output high when both inputs are high, and when either or both the inputs are high, their output is low. On the other hand, NAND gates of this type require both inputs to be high for an output to be low but either input must be low for the output to be high.

Assuming now that switch 21 is closed, both conductors 32c and 32d are grounded (become low) and consequently the output of NAND gate 37 becomes high. Since no signal appears at the output of inverter 41, the second input to NOR gate 38 is low. With its first input going high, its output becomes low, and capacitor C1 begins charging through resistor 43. The time constant of resistor 43 and capacitor 39 determines the rate of charge thereof. In the meantime, the sudden dropping to low potential of the output of NOR gate 38 has caused the input of inverter 41 to go low, causing its output to go high, presenting a high input to NOR gate 38. NOR gate 38 is thus made immune to further bounces (sudden rapid dropouts of the potential to low value).

As capacitor C1 charges up, at the threshold point of inverter 41, that is, where its input becomes sufficiently high that it causes its output to drop to low level, it will switch and present a low level signal to the second input of NOR gate 38. Accordingly, the immunity to bounce of NOR gate 38 is removed. In the meantime, the output of inverter 41 has been observed to suddenly rise and present a pulse of high level to the input terminals of inverter 42, the pulse having a time constant determined by resistor 43 and capacitor 39. Accordingly, the depression of switch 1 for whatever length of time desired, provides a pulse of controlled time constant to inverter 42.

Upon release of the switch 1, ground is removed from the input terminals of NAND gate 37, again with bounce. The leading edge of the signal returned to high level will result in a high signal appearing at the output of NOR gate 38, which has been seen to drop to low level and return to high level during the entire duration of the closing of switch 1. This return to high level would have no affect on inverter 41 if it were not for the bounce effect, which provides rapid fluctuations back to high level. The presence of resistor 40 shows the discharge of capacitor 39 from the input of inverter 41 during the bounce fluctuations, thus not substantially affecting inverter 41.

In summary, therefore, with the depression of the first switch 21, we have obtained a high level pulse at the input terminals of inverter 42 for controlled time interval, as well as a low level signal at the output of NOR gate 38 for the entire period of closure of the switch.

The controlled time pulse is inverted in inverter 42, and applied to one of the two inputs of NOR gate 53. The output of NOR gate 53 is applied to the preset-enable input 54 of tens counter 36, which causes the tens counter to store the binary digit applied from conductors 32a . . . 32d, to its input terminals 36a . . . 36d.

The preset-enable pulse, however, is only applied when a low signal appears at the other input terminal or NOR gate 53, which is available from output terminal 162 of flip flop 51. Flip flop 46 will have already had its terminal 52 at low level (and its output 48 at high level), since its input 47 causes a change in state of its output only upon receipt of a return from low level to high level input signal edge. Gate 44 will therefore not provide a preset-enable pulse to terminal 45 of counter 35.

Accordingly, NOR gate 53 is presented with a low level input from terminal 162 of flip flop 51, and a low level pulse from the output of inverter 42, and provides a high level pulse at the preset-enable input 54 of tens counter 36. The counter is thus caused to store the binary signal applied via terminals 36a . . . 36d.

In the meantime, the other terminal 48 of flip flop 46 provides a high level signal to NOR gate 44, the other input terminal of which is connected to the output of inverter 42. Accordingly, when the low level enable pulse is passed to NOR gate 44, it cannot pass it, and counter 35 does not store the digits applied to it via terminals 34a . . . 34d.

Once the switch 21 is released, as described earlier, flip flop 46 is caused to change state, and terminal 52 thereof is caused to go to high level, and terminal 48 to low level. The application of high signal from terminal 52 of flip flop 46 to terminal 61 of flip flop 51 causes its terminal 162 to go high. Since the earlier timed pulse is complete, no signal passes through NOR gates 44 or 53, since one input terminal of each is high. However, with the signal appearing at terminal 52 of flip flop 46 applied to the set input terminal 61 of flip flop 51, output terminal 62 is caused to become low. Terminal 62 is connected to the base of PNP transistor 63 via a current limiting resistor (although the low going output terminal of flip flop 51 could have been used if an NPN transistor were provided, with reverse polarity power supplied).

The emitter of the transistor 63 is connected to a source of positive potential, and the collector is connected to the power supply input terminal $V_t$ of a pair of oscillators 55. A light emitting diode 64, connected through a current limiting resistor 65 is connected to the collector of transistor 63 and to ground.

Oscillators 55 provide an output signal at terminal 56 of ultrasonic frequency. A lower frequency square wave is also produced at the desired pulsing rate. The rates of oscillation are determined by either internal or external components, by well known techniques, which therefore will not be described. Inhibiting of the high frequency signal is done by application of a low level signal at terminal 59, and the low frequency can be inhibited by application of a low level signal at terminal 60. The low frequency output signal generated is obtained at terminal 58.

At the completion of the release of the first push button, as described earlier, terminal 48 of flip flop 46 will be at low level. Accordingly, the low frequency oscillator enable terminal 60, being connected thereto, is inhibited. However, the same low level signal is applied to NAND gate 66, where it is inverted to high level. Consequently the high frequency portion of the oscillator will be enabled, along with the turning on of the oscillator power $V_t$ from the collector of transistor 63. An ultrasonic frequency signal is thus generated, and applied to ultrasonic transducer 57, from which it is transmitted through the air to a receiver.

When the second switch 28 is closed, a new binary code is applied to conductors 32a . . . 32d, and also to terminals 34a to 34d and 36a to 36d of units and tens counters 35 and 36 respectively. A second timed pulse is generated as described earlier, and appears as a low level pulse at the output terminal of inverter 42. The low level pulse is applied as before to NOR gates 44 and 53. However, flip flop 46 has not changed its state, since it has not encountered an increasing leading edge at its input terminal 47, and therefore at this point has its terminal 52 high, and its terminal 48 low. Accordingly, NOR gate 44 enabled, passing the pulse through to preset enable terminal 45 of units counter 35. The units counter thus is caused to accept and store the binary number which is present at its terminals 34a to 34d.

With the release of switch 28, however, flip flop 46 encounters an increasing leading edge at its input terminal 47, and consequently changes the state of its output terminals, with terminal 52 becoming low and terminal 48 becoming high. This removes the inhibit low level at terminal 60 of oscillator 55, causing the low frequency oscillator to begin operation. This appears as a low level interrupt at terminal 58.

With low level occurring at terminal 58 this is applied through a second input terminal of NAND gate 66, inverted, to enable the high frequency oscillator at terminal 59 during the interrupts. The high frequency oscillator will operate in bursts during the low frequency interrupt periods, due to the removal of the low level signal applied to the first input terminal of NAND gate 66 when flip flop 46 changed state at the time of opening of input switch 28.

The interrupt (low going) signal from low frequency oscillator output terminal 58, is applied to NOR gate 67, which is connected as an inverter (if the inverter is required) and appears as a clock pulse input to counter 35 at terminal 49. Counter 35 will therefore begin counting down in step with the clock signal, each pulse of the clock also being transmitted as an ultrasonic frequency pulse. Each time counter 35 cycles to zero, a clock pulse is sent from terminal 68 of counter 35 through a capacitor, bypassed to ground by a resistor, if those components are required, to clock input terminal 69 of tens counter 36. With the zero state output terminal 70 of counter 36 connected to carry forward input terminal 71 of counter 35, counter 35 will continue cycling until a zero count indication has been provided from the tens counter, after which it will cycle to zero and provide a zero indication at its output terminal 50. The zero indication is a high level going signal, which is applied to the input terminal 72 of flip flop 51, causing it to change its state, and remove low level signal from its output 62. This switches transistor 63 off, removing the source of power from the oscillator, turning it off. Accordingly, both low and high frequency oscillators cease operation, and the transmitting of ultrasonic frequency bursts ceases. The number of bursts transmitted, being in step with the low frequency oscillator clock signal and the counts of the counters 35 and 36, has provided a duplicate number of bursts as the total decimal number originally input by closing the two switches 21 and 28 sequentially.

All flip flops are seen to have been restored to their original state, and the counters both cycled to zero.

The counters can be type MC14522 available from Motorola, Inc., while the combined oscillator can be type NE556 available from Signetics Corp. The NAND gates can be part MC14011 and the NOR gates part MC14001 from Motorola Inc. The flip flops are available as part MC14027 from Motorola Inc.

Turning now to the receiver, its structure and operation is as follows.

Figure 7:
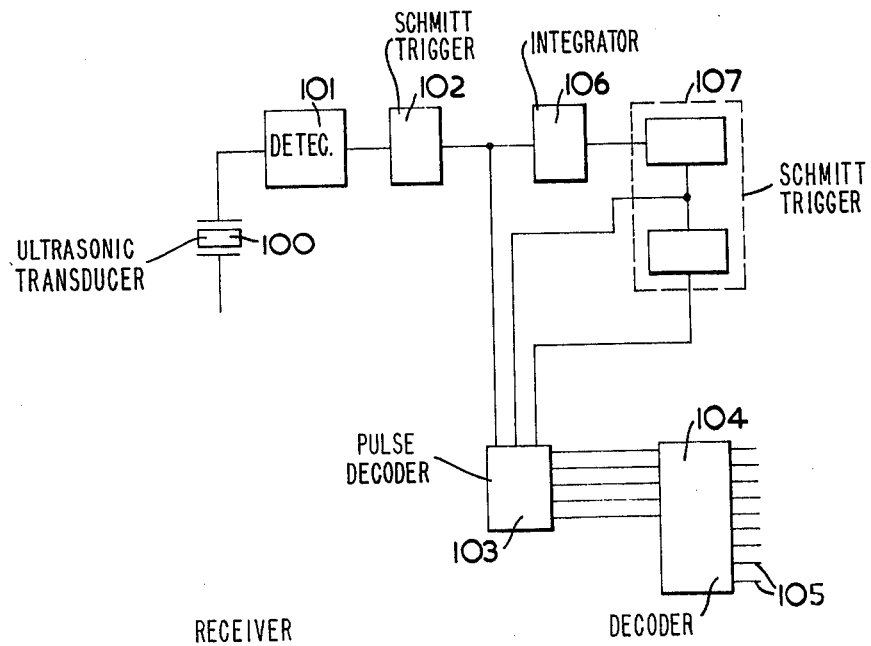
FIG. 7 is a detailed block diagram of the receiver of the present invention.

Turning now to FIG. 7, one embodiment of the receiver is shown in block schematic. Transducer 100 receives the ultrasonic signal and passes it to an amplifier and detector 101. After moving, the resulting signal is the envelope or equivalent of the ultrasonic pulses transmitted from the remote transmitter.

As noted earlier, the ultrasonic signal could be substituted by a modulated light beam, a radio signal, or the like.

The pulses are then applied to a first Schmitt trigger 102 which provides a square wave representation of the signal envelope, being responsive to the leading and trailing edges thereof with hysteresis. The signal is then applied to a pulse decoder (or counter) 103, which counts the number of pulses and provides an output signal corresponding to the total number of pulses counted to decoders 104. In the event the output signal is in binary, the decoder will be a binary decoder, which is used in this example. The binary decoder provides a switching signal at one of its output conductors 105. Switching means (not shown) such as saturating transistor switches or the like may be operated by the signals appearing on the conductors. For instance, for a particular pulse count, a particular conductor in the binary decoder will have a ground applied thereto as an output signal, causing a particular transistor switch to begin conduction.

The switching means is usefully combined in a resistance network together with a varactor diode to apply a particular voltage across the varactor diode in a well known manner. More specifically, each of the transistor switches, when operated, will cause a particular voltage to be applied across the varactor. Since the capacitance across the varactor diode varies with applied voltage, it can then be used within a receiver, such as a television or FM radio receiver to tune to a selected channel or station.

It will be recalled that the preferred ultrasonic signal contains a prepulse, of significant length, such as longer than 200 milliseconds. The prepulse length is chosen to be longer than the expected ambient noise pulse period in the environment, 200 milliseconds or longer having been found to be satisfactory by experiment for normal home environments.

For reasons to be explained below, the pulse decoder or counter 103 will not accept and count the received pulses until it is enabled by reception of the prepulse.

The received signal of the prepulse followed by the transmitted pulses, appearing at the output of the Schmitt trigger 102 in highly linear form, is applied to integrating means 106. Integrator 106 has a time constant as described earlier, such as 200 milliseconds.

The output of the integrating means 106 will therefore appear as a gradually decreasing signal to a particular level, over the selected time constant. As the pulsing signals arrive following the prepulse, the amplitude will increase slightly, then decrease to the low level in time with the pulses, but not vary to a great extent. Following the end of the last pulse, however, it will gradually rise to its former high level. It should be noted, that noise or other random pulses will cause the output of the integrator to decrease only slightly in amplitude from its high level, but will not cause the integrator to provide a constant low level signal as would the long prepulse.

The output signal of the integrator 106 is applied to second Schmitt trigger 107, which will "set" at a predetermined low level signal output from the integrator, and "reset" when the signal rises through that same threshold. The output signal of the Schmitt trigger will therefore appear at one terminal as a long time pulse, starting from its set period after the beginning of the integration, and ending at its reset time, at which time the integrator output signal will have risen to the threshold of the second Schmitt trigger 107. Accordingly, we have now generated a signal which covers the entire pulse reception time for all pulses.

Another terminal of the Schmitt trigger (or the output signal itself, differentiated), will provide a sharp reset pulse corresponding to the leading edge of the long time pulse.

The long time pulse is used as an inhibit release (or enable) signal, and is applied to decoder 104. The reset pulse is applied to the counter 103. Accordingly, the counter is reset to zero at the time of generation of the long time pulse. Since this occurs during the prepulse period, the decoder is thus cleared to zero in anticipation for counting the following pulses which are applied directly from the output of the first Schmitt trigger 102.

At the same time, the long time pulse is applied as an enable signal to the second stage of the counter 103. This can be used to force the output of the decoder 104 to a false high number (with a resultant non-existent output) while counting is carried on.

It may be seen, therefore, that the ultrasonic prepulse has been detected and utilized to clear and enable the counter to accept the detected pulsing ultrasonic signal, count the pulses, and provide a switching signal on one of the conductors 105. This can be used, as described earlier, to switch on a selected semi-conductor switch, to provide a voltage across a varactor diode such that the television receiver in which it is located is tuned to a selected station.

Figure 8:
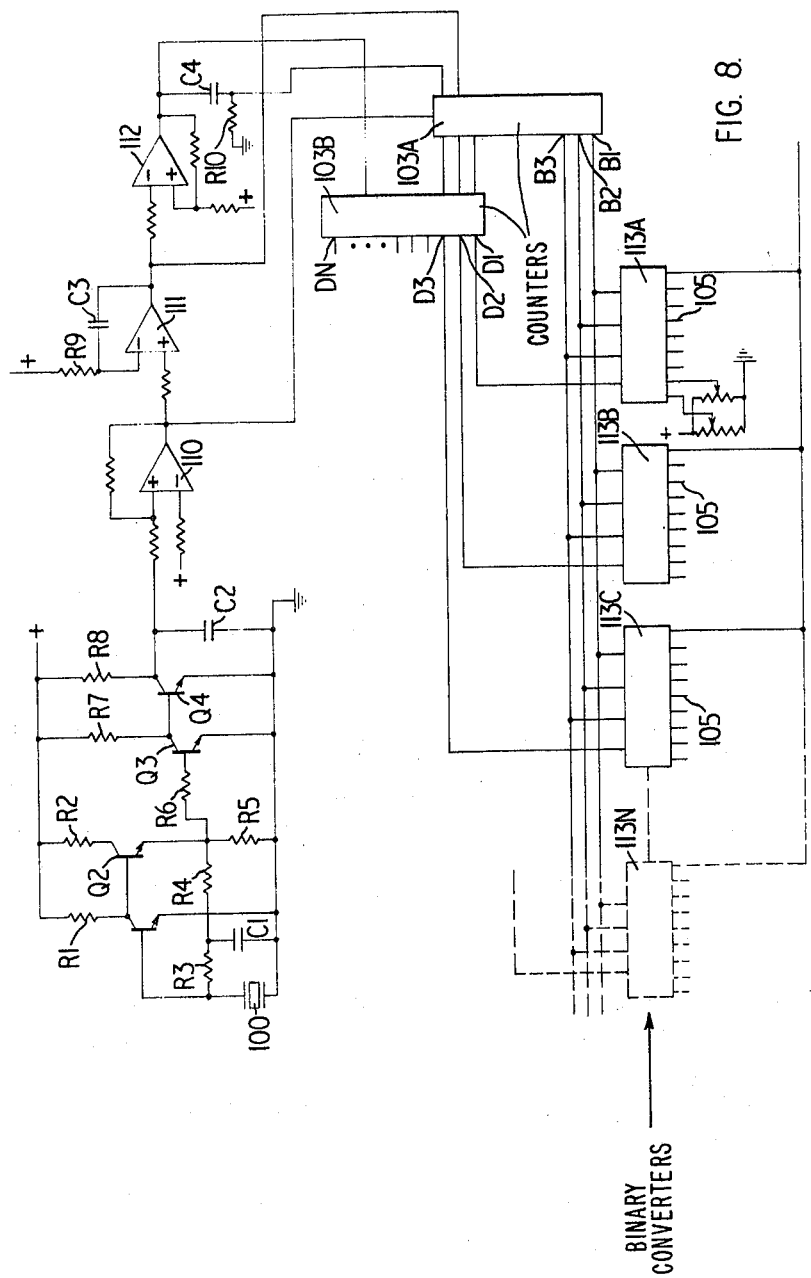
FIG. 8 is a detailed schematic of the receiver of the present invention.

Turning now to FIG. 8, a detailed schematic diagram is shown of the receiver. Shown is transducer 100, which may be any well known ultrasonic acoustic to electrical transducer. The signal is applied to the base of transistor 21, which amplifies it and passes it to the base of transistor 22. The transistors can be biased in a well known manner, as shown. Resistor R1, connected between the collector of transistor Q1 and a source of potential, resistor R2 connected between the collector of transistor Q2 and the same source, resistors R3 and R4, series connected between the emitter of transistor Q2 and the base of transistor Q1, can each be 51,000 ohms. Resistor R5 connected between the emitter of transistor Q2 and ground can be 6,800 ohms. Capacitor C1 connected between the junction of resistors R3 and R4 can be 0.01 microfarads. The emitter of transistor Q1 is connected to ground.

With transistor Q2 used as an emitter follower, the signal is applied through resistor R6, which can be 100,000 ohms, to the base of transistor Q3. A resistor R7 connected between the collector of transistor Q3 and a source of potential can be 100,000 ohms. The emitter of transistor Q3 is connected to ground. The collector of transistor Q3 is connected directly to the base of transistor Q4, which has a resistor R8 connected between its collector and a source of potential, the resistor being 51,000 ohms. The emitter of transistor Q4 is also connected to ground.

Transistors Q3 and Q4 are biased to detect the signal applied thereto, a resulting envelope appearing at the collector of transistor Q4. Capacitor C2, connected between the collector of transistor Q4 and ground, and which may be 0.2 microfarads acts as a hold-down capacitor. With R8, the charging time constant is long in comparison to the short time constant discharge both through the emitter of transistor Q4.

It will be noted that all the active elements in the aforenoted amplifier-detector is available as a integrated circuit from Microsystems International Limited, Ottawa, Canada, as part number ML3046P.

The output signal is then applied to operational amplifier 110, which is connected as a Schmitt trigger in a well known manner. The output signal is then applied to pulse counter 103, which, as may be seen, can be made up of two parts, which will be described later.

The output signal of the Schmitt trigger is also applied to operational amplifier 111, which is connected in a well known manner as an integrator. This is constructed using capacitor C3 between its other input and its output terminals, and resistor R9 between the input to which capacitor C3 is connected and a source of potential. The time constant is determined by the value of resistor R9 and capacitor C3, and may usefully be 1 megohm and 0.2 microfarads respectively.

The output signal from the integrator 111 is applied to a second Schmitt trigger connected in a well known manner with operation amplifier 112, which provides at its output the aforenoted inhibit-release long pulse, and which is connected to pulse counter 103. The output of the second Schmitt trigger is differentiated via capacitor C4 and resistor R10 (which may be 0.1 microfarads and 10,000 ohms, respectively) and applied to the reset input of counter 103.

Accordingly, we have an inhibit release long pulse applied to counter 103, a reset pulse, which is generated at the beginning of the long pulse, and serves to clear the counter to zero, applied prior to the application of the remaining pulses of the entire signal train from the Schmitt trigger to counter 103. A counter enable signal may also be obtained, if desired, from the output of integrator operational amplifier 111, and applied to counter 103.

The two sections of counter 103 may usefully be connected together in a well known manner, whereby a binary output is obtained at terminals B1, B2, and B3, and stage selection decoded output obtained at terminals D1, D2, D3 . . . Dn, of the second stage. The counted numerals are applied to 1 out of 8 binary converters 113a, 113b . . . 113n in a well known manner, the particular converter stage selected being determined by the signal on one of the terminals D1 . . . Dn. Accordingly, at one of output conductors 105 a switching signal will appear which corresponds to the counted number of pulses, excluding the prepulse, transmitted by the transmitter and translated in the receiver.

Usefully, the converters will incorporate switching transistors responsive to the switching signal, and a common to each converter will be switched to an output terminal 105. This provides a convention structure for switching a potentiometer array selectively across a varactor diode to provide a selected voltage thereacross.

Decoder portion 103 which can usefully be used as a stage selector is RCA part number CD 4024AE, while the counter portion thereof can be RCA part number CD 4028AE. Converters 113a . . . 113n can be RCA parts number CD 4051.

Figure 9:
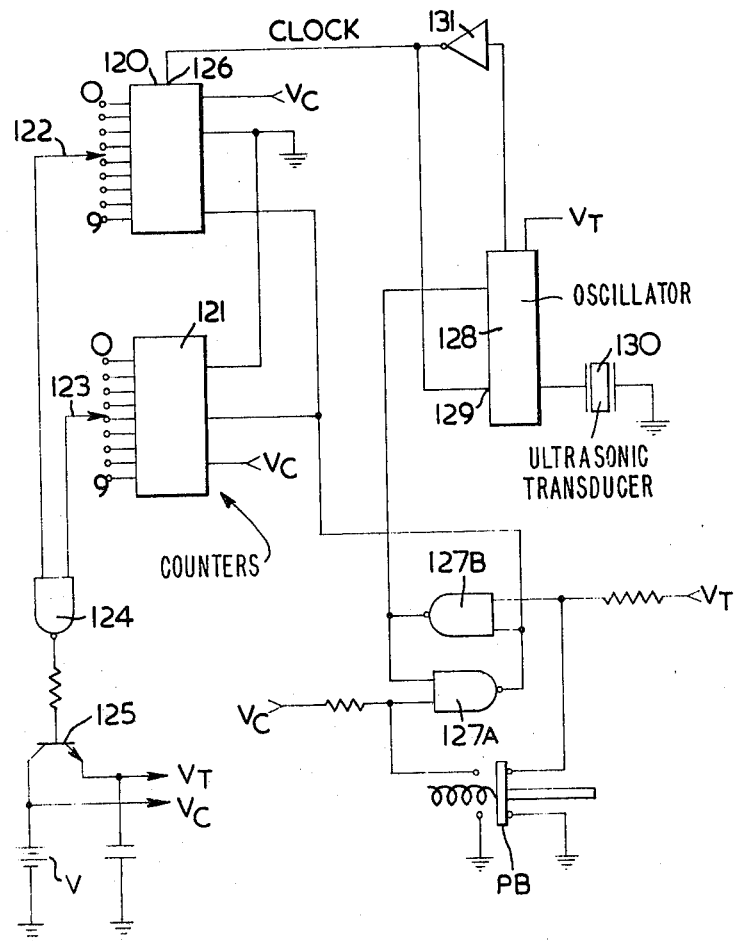
FIG. 9 is a schematic of another embodiment of the transmitter of the present invention.

Another embodiment of the transmitter is described below and shown in FIG. 9.

Counters 120 and 121 preferably decoded decade counters, have their decimal input terminals connected to maintained make switches, such as rotary or push button switches 122 and 123. The common contacts of each of the switches are connected to two input terminals of NAND gate 124, which has its output connected to a transistor switch 125. The transistor switch, once enabled, will allow current to flow from battery V to power output terminal $V_t$.

Counters 120 and 121 could also be ring counters or the like. When counters 120 and 121 are caused to count by the application of a clock pulse at terminal 126, carried, to counter 121, transistor 125 causes output voltage at $V_t$ to appear until the counter has counted to the conductor designated by switches 122 and 123. At that point, voltage at $V_t$ is cut off.

Push button switch PB, when pushed, applies ground potential to NAND gate 127A, which applies a reset signal to counters 120 and 121.

At the same time, NAND gate 127B has the reset pulse applied to it, which applies an enable signal to dual oscillator 128. One portion of oscillator 128 is adapted in a well known manner to oscillate at a clocking rate, which output is applied to input terminal 126 of counter 120. The output thereof is also applied to the inhibit input 129 of the ultrasonic frequency portion of oscillator 128, causing it to switch off and on. It should be noted that the low clock frequency oscillator will not be in operation until a signal appears from the output of NAND gate 127B. This will not occur until the second input of oscillator 128 is grounded through the second position of push button PB, which is connected when the push button is released. Yet the high frequency oscillator begins operating once voltage $V_t$ is applied.

It should be noted that switch debouncing effect is obtained by gates 127A and 127B.

The output of the oscillator is, first a long pulsing signal, while the push button is depressed. Once the push button is released, the pulsing ultrasonic signal is transmitted from oscillator 128 via ultrasonic transducer 130.

In operation, push button PB is depressed, applying ground to NAND gate 127. A reset signal is thus applied to counters 120 and 121, which causes a low signal to appear at all of its decade outputs except the "o" output, and subsequently the one which is being counted at that particular time. Accordingly, both of switches 122 and 123 have a low signal applied, which causes NAND gate 124 to switch transistor 125 on, causing voltage $V_t$ to be applied to oscillator 128 and NAND gate 127B. Because no oscillator reset signal is present at this time, a continuous ultrasonic signal is generated and transmitted via ultrasonic transducer 130.

As the counter counts through the contact switch points of switches 122 and 123, potential at $Vt$ will still remain as long as at least one of the inputs of NAND gate 124 is receiving signals. No counting has yet begun, but the counters have been reset to zero.

With push button PB released, ground is applied to NAND gate 127B, which causes a low input signal at both of its input terminals. A reset signal is thus generated and is applied to the low frequency portion of oscillator 128, which begins oscillating, and applying a clock signal to terminal 126 of counter 120, which, each decade, applies a clock pulse to counter 121 in a well known manner.

With counters 120 and 121 counting up, simultaneous with the generation of bursts of ultrasonic pulses, eventually ground will be applied to the common of both switches 122 and 123, which will cause NAND gate 124 to shut off transistor 125 and remove potential $V_t$ from the oscillator. This shuts it off, terminating the transmitted pulse train.

As it is preferred that the counters used herein be of complementary symmetry MOS integrated circuit type, potential $V_c$, obtained from the potential source V (which may be a nine volt alkaline battery, for instance) may be applied permanently, unswitched, to counters 120 and 121. Preferably, the counters are the NE556 decoded decade counters available from Signetics Corporation. The oscillators are available as NE556 dual timers from the same firm. The NAND gates are available as MC14011 from Motorola, Inc.

The above embodiment has therefore been shown to provide an ultrasonic prepulse, which is generated by the transmit push button PB, followed by a pulse train, the count of the number of pulses being determined by the setting of switches 122 and 123. The pulse train following the prepulse will occur when the push button PB is released.

The receiver will be cleared and prepared by the prepulse to count the pulses which follow effectively selecting a desired channel or station. In this form of transmitter, rather than pushing momentary make push buttons as in the first-described embodiment, they must be selected and held, as in a pair of rotary switches. This may be a less desirable feature from the point of view of the user, but allows the fabrication of a considerably less expensive form of transmitter. However, a rotary type switch will provide a visible memory of the last selected channel, which is a desirable feature.

In all of the above embodiments, it should be noted that the specific number of pulses need not exactly correspond to the digit selected by the operator. The number of pulses can be preceded by a specific number of pulses, to provide a greater pulse count. Indeed, the number of pulses counted can be of harmonic relationship to the digit selected, or any functional relationship. The prepulse can be provided as a predetermined number of pulses of ordinary length, which, when counted, will enable the receiver to count the following pulses, which may, if desired, include the pulses of the prepulse.

In this respect, the claims are intended to be construed as including in the word "prepulse," a series of pulses of predetermined length, as well as a single pulse of extended length, either preceding, or being included with the pulse train as part of the pulse count.

The embodiments of the invention in which an exclusive property or privilege is claimed are defined as follows:

1. Remote switching apparatus comprising:
   (a) a multiplicity of selection switches,
   (b) encoding means connected to said switches for providing a numerical output upon the sequential actuation of any two of said switches,
   (c) means responsive to the actuation of the first of said switches for the generation of prepulse signal,
   (d) means responsive to the following actuation of another of said switches, for translating the numerical output resulting from the actuation of both said switches for generating a pulsing signal corresponding to said numerical output, and
   (e) means for transmitting said prepulse signal followed by said pulsing signal.

2. A remote switching means as defined in claim 1, in which said means for generating the pulsing signal comprises a counter preset by the numerical output, and actuated by a clock for decrementing said numerical output preset within the counter to zero, said (e) means being adapted to transmit a burst of signal at a single frequency at each count.

3. Remote switching apparatus as defined in claim 1 further including:
   (a) signal receiving means
   (b) counting means responsive to the receiving means for counting the number of pulses in said pulsing signal,
   (c) means responsive to the receiving means for resetting the counting means to zero upon reception of the prepulse signal,
   (d) means responsive to the counting means for providing a switching signal on one of a group of conductors, each of which corresponds to a predetermined pulse count.

4. Remote switching apparatus as defined in claim 3, further including individual switching means connected to each of said conductors, individually operated by a switching signal appearing on its corresponding conductor.

5. In a tuning apparatus remote switching apparatus as defined in claim 4, further including a varactor tuning diode, a network of resistors and said switching means connected to said diode, said switching means in cooperation with said resistors being adapted to vary the voltage applied to the varactor diode as an individual switching means is operated in response to the reception of a transmitted count of signal pulses.

6. Remote switching apparatus comprising:

(a) means for generating a single frequency signal, (b) a first switching means for causing transmission of a continuous single frequency prepulse signal, (c) control means connected to the (a) means for terminating the prepulse signal and for sequentially causing outpulsing of said single frequency signal a predetermined number of times in response to the actuation of a second switching means, the number of pulses being related to the numerical designation of the second switching means.

7. Remote switching apparatus as defined in claim 6 in which said signal is an ultrasonic acoustic signal.

8. Remote switching apparatus as defined in claim 7, further including means for receiving the signal, counting the number of pulses within said signal upon prior reception of the prepulse signal, and for providing a switch operating signal in response thereto, corresponding to the pulse count of said signal.

9. Remote switching apparatus as defined in claim 7, further including means for receiving the ultrasonic signal, means for resetting the counting means to zero upon reception of said prepulse, counting means for counting the number of pulses within said signal and means for providing a switch operating signal, corresponding to the pulse count, in response to the completion of the count of pulses in said signal.

10. Remote switching apparatus comprising:
   (a) means for providing an input signal comprising a pair of sequential digits,
   (b) counter means for counting and storing said digits,
   (c) oscillator means for providing a continuous wave output signal,
   (d) means for sensing the input of the first digit, and enabling the generation and continuous transmission of said output signal,
   (e) means for sensing the input of the second digit, for enabling the counting of both first and second digits, causing transmission of pulses of said output signal of a count corresponding to the input digits, then inhibiting further transmission of said output signal.

11. Remote switching apparatus as defined in claim 10, in which said (e) means comprises:
   (i) a pair of counters, the first counter being adapted to store and count a tens digit and the second counter being adapted to store and count a units digit,
   (ii) means for enabling storage of the first digit in the first counter upon reception of the first digit,
   (iii) means for enabling storage of the second digit in the second counter upon reception of the second digit,
   (iv) means for enabling continuous wave transmission of said output signal after completion of input of the first digit.

12. Remote switching apparatus comprising:
   (a) a multiplicity of switches,
   (b) encoding means for providing a binary signal output corresponding to a predetermined number upon closure of one of the switches,
   (c) a pair of counters, connected to the output of the encoding means, adapted, once enabled and provided with a clock input signal, to count the number encoded by closing a pair of said switches individually and sequentially,
   (d) means for providing an enable signal from the output of the encoding means upon closure of any of said switches,
   (e) a first toggle flip-flop for directing the enable signal to one counter upon one switch operating, and to the other counter upon a second switch operating, whereupon first the first digit and then the second digit are stored in the respective counters,
   (f) a high frequency oscillator, enabled after the completion of the operation of the first switch, from the second flip-flop, for providing transmission of an output signal,
   (g) a second flip-flop, operated by the first flip-flop, for enabling power supply to the oscillator,
   (h) a second oscillator of lower frequency than the first, providing a clock signal, adapted to modulate the first oscillator, inhibited by a zero indication in said counters,
   (i) means for enabling operation of both counters and operation of the low frequency oscillator, whereby clock signals are applied to said counters, causing the high frequency signal to be modulated in step with the clock as the counters count, a zero count indication providing a signal to cause the second flip-flop to inhibit power supply to the oscillator switching it completely off, and ceasing transmission of output signal.

13. Remote switching apparatus as defined in claim 3 in which said receiving means comprises:
   (i) a signal transducer,
   (ii) signal amplifying and detecting means connected to said transducer, for providing a pulse signal or each burst of signal,
   (iii) a first Schmitt Trigger connected to the detecting means for providing a square wave representation approximately in time and phase with the pulse envelope signal, and in which the counting means comprises:
   (iv) a pulse decoding means connected to the Schmitt trigger for providing a binary output representation of the count of the number of pulses in the pulse envelope signal, and
   (v) means connected to the pulse decoding means for providing said switching signal on one of said conductors, corresponding to the numerical designation of said count.

14. Remote switching apparatus as defined in claim 13, in which the resetting means comprises:
   (x) an integrating means connected to the first Schmitt trigger for integrating said pulse envelope signal, having a predetermined time constant,
   (xi) a second Schmitt trigger connected to the integrating means for providing an inhibit release pulse, of length extending from the trigger set time after the beginning of integration of the prepulse signal, to the trigger reset time after the end of the last pulse of said pulsing signal,
   (xii) differentiating means connected to the second Schmitt trigger for differentiating the leading edge of the inhibit release pulse, to provide a reset pulse,
   (xiii) means for applying the inhibit release pulse to the pulse decoding means for enabling acceptance and counting from the first Schmitt trigger,
   (xiv) means for applying the reset pulse to the pulse decoding means for resetting its counted value to zero in preparation for reception and counting of pulses from the first Schmitt trigger.

15. Remote switching apparatus as defined in claim 11, further including individual switching means connected to each of said conductors individually operated by a switching signal appearing on its corresponding conductor, a varactor tuning diode, a network of resistors and said switching means connected to said diode, said switching means in cooperation with said resistors being adapted to vary the voltage applied to the varactor diode as an individual switching means is operated in response to the reception of a transmitted count of ultrasonic pulses.

16. Remote switching apparatus as defined in claim 7, further comprising:
(a) a signal generator,
(b) a transmit start switch for switching on said generator,
(c) a selection switch having a plurality of contacts, including means for selecting and making and holding contact to one of the contacts,
(d) counting means for sequentially counting said contacts from a zero contact, upon reception of a clock signal,
(e) a clock signal generator connected to said counting means, and to an inhibit input of the signal generator,
(f) means for providing an enable signal to the clock signal generator to enable clock signals to regularly interrupt generation of the ultrasonic signal, and simultaneously cause counting of the counting means, upon release of the transmit start switch, and
(g) means for shutting off the ultrasonic signal generator and the clock signal generator upon the counting means having counted to said one of the contacts.

17. Remote switching apparatus as defined in claim 16, further including means for resetting the counting means to zero at the time of switching on the signal generator.

18. Remote switching apparatus as defined in claim 16, in which the counting means is comprised of at least a pair of counters; said selection switch having a switch bank corresponding to each counter, the plurality of contacts of each switch bank connected to its corresponding counter; the individual counters of all switch banks being connected to individual inputs of a NAND gate; a power supply, semiconductor switch means connecting the power supply to both said signal generators, and means for connecting the output of the NAND gate to the switching means, for switching the semiconductor switching means off upon all the selected contacts of all the switch banks having been counted to by all the counting means.

19. Remote switching apparatus as defined in claim 16 in which said signal generator is adapted to provide an ultrasonic acoustic signal.

* * * * *